United States Patent
Jee et al.

(10) Patent No.: US 10,074,752 B2
(45) Date of Patent: Sep. 11, 2018

(54) CONDUCTIVE PASTE AND ELECTRONIC DEVICE AND SOLAR CELL

(71) Applicant: Samsung Electronics Co., Ltd., Suwon-Si, Gyeonggi-Do (KR)

(72) Inventors: Sang Soo Jee, Hwaseong-si (KR); Suk Jun Kim, Suwon-si (KR); Eun Sung Lee, Hwaseong-si (KR); Se Yun Kim, Seoul (KR); Jin Man Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 66 days.

(21) Appl. No.: 13/904,618

(22) Filed: May 29, 2013

(65) Prior Publication Data
US 2014/0000694 A1 Jan. 2, 2014

(30) Foreign Application Priority Data
Jun. 27, 2012 (KR) .................. 10-2012-0069242

(51) Int. Cl.
*H01L 31/0224* (2006.01)
*H01B 1/22* (2006.01)

(52) U.S. Cl.
CPC .......... *H01L 31/0224* (2013.01); *H01B 1/22* (2013.01); *H01L 31/022425* (2013.01); *Y02E 10/50* (2013.01)

(58) Field of Classification Search
USPC ................................................ 136/200–243
See application file for complete search history.

(56) References Cited

U.S. PATENT DOCUMENTS

| | | | |
|---|---|---|---|
| 6,120,586 A | 9/2000 | Harada et al. | |
| 2003/0161959 A1* | 8/2003 | Kodas et al. | 427/376.2 |
| 2004/0004209 A1* | 1/2004 | Matsuba | B22F 1/0062 252/518.1 |
| 2010/0021704 A1* | 1/2010 | Yoon et al. | 428/209 |
| 2010/0037990 A1 | 2/2010 | Suh | |
| 2011/0114170 A1* | 5/2011 | Lee et al. | 136/256 |
| 2011/0147677 A1* | 6/2011 | Carroll | C03C 3/07 252/519.3 |
| 2011/0192457 A1 | 8/2011 | Nakayama et al. | |
| 2012/0031481 A1 | 2/2012 | Jee et al. | |
| 2012/0037216 A1 | 2/2012 | Kim et al. | |
| 2012/0037221 A1 | 2/2012 | Kim et al. | |

(Continued)

FOREIGN PATENT DOCUMENTS

| | | |
|---|---|---|
| CN | 101523508 A | 9/2009 |
| CN | 102097153 A | 6/2011 |

(Continued)

OTHER PUBLICATIONS

European search report dated Sep. 16, 2013 in European Patent Application No. 13171294.5.

(Continued)

*Primary Examiner* — Magali P Slawski
(74) *Attorney, Agent, or Firm* — Harness, Dickey & Pierce, P.L.C.

(57) ABSTRACT

A conductive paste may include a conductive powder, metallic glass, a metal precursor including an element forming a solid solution with the metallic glass, and an organic vehicle, and an electronic device and a solar cell may include an electrode formed using the conductive paste.

25 Claims, 5 Drawing Sheets

(56) References Cited

U.S. PATENT DOCUMENTS

2012/0048363 A1  3/2012  Jee et al.
2012/0313198 A1  12/2012  Ittel et al.

FOREIGN PATENT DOCUMENTS

| CN | 102376379 A | 3/2012 |
|---|---|---|
| EP | 2325848 A2 | 5/2011 |
| EP | 2416327 A1 | 2/2012 |
| EP | 2450908 A2 | 5/2012 |
| JP | 2008-226816 A | 9/2008 |
| JP | 2009099371 A | 5/2009 |
| JP | 2009138266 A | 6/2009 |
| JP | 2010018878 A | 1/2010 |
| JP | 2011-103301 A | 5/2011 |
| JP | 2012-043789 A | 3/2012 |
| JP | 2012-094518 A | 5/2012 |
| KR | 10-2002-0037772 A | 5/2002 |
| KR | 2008-0029655 A | 4/2008 |
| KR | 2008-0029826 A | 4/2008 |
| KR | 2011-0052452 A | 5/2011 |

OTHER PUBLICATIONS

Hilali et al., "Effect of Ag Particle Size in Thick-Film Ag Paste on the Electrical and Physical Properties of Screen Printed Contacts and Silicon Solar Cells", *Journal of the Electrochemical Society*, vol. 153, No. 1, pp. A5-A11 (2006).

Chinese Office Action dated Feb. 23, 2016 issued in corresponding Chinese Patent ApplicationApplication No. 201310262888.1 (English translation provided).

Japanese Office Action dated Apr. 25, 2017 issued in corresponding Japanese Application No. 2013-134990 (English translation provided).

\* cited by examiner

CONDUCTIVE PASTE AND ELECTRONIC DEVICE AND SOLAR CELL

CROSS-REFERENCE TO RELATED APPLICATION

This application claims priority to and the benefit of Korean Patent Application No. 10-2012-0069242 filed in the Korean Intellectual Property Office on Jun. 27, 2012, the entire contents of which are incorporated herein by reference.

BACKGROUND

1. Field

Example embodiments relate to a conductive paste, and an electronic device and a solar cell including an electrode formed using the conductive paste.

2. Description of the Related Art

A solar cell is a photoelectric conversion device that transforms solar energy into electrical energy, and has been drawing attention as an infinite but pollution-free next-generation energy source.

A solar cell includes a p-type semiconductor and an n-type semiconductor. A solar cell produces electrical energy by transferring electrons and holes to n-type and p-type semiconductors, respectively, and then collecting electrons and holes in each electrode, when an electron-hole pair (EHP) is produced by solar light energy absorbed in a photoactive layer inside the semiconductors.

A solar cell is required to have as much efficiency as possible for producing electrical energy from solar energy. In order to increase solar cell efficiency, it is important to take produced charges outside without loss, as well as to produce as many electron-hole pairs as possible in the semiconductor.

An electrode may be fabricated by a deposition method, which has a complicated process, a relatively high cost, and takes a relatively long time. Accordingly, a simplified process using a conductive paste has been suggested.

The conductive paste includes a conductive powder and glass frit. However, the glass frit has relatively high resistivity and has a limit for improvement of conductivity of an electrode. Recently, a conductive paste using metallic glass instead of glass frit has been researched.

However, when using the conductive paste including metallic glass, the component for metallic glass may be chemically reacted with silicon for a semiconductor substrate to provide an oxide layer having an excessive thickness. The oxide layer may deteriorate conductivity between the semiconductor substrate and the electrode.

SUMMARY

Example embodiments provide a conductive paste being capable of improving conductivity between a semiconductor substrate and an electrode. Example embodiments also provide an electronic device including an electrode formed using the conductive paste. Example embodiments also provide a solar cell including an electrode formed using the conductive paste.

According to example embodiments, a conductive paste may include a conductive powder, a metallic glass, a metal precursor including an element that forms a solid solution with the metallic glass, and an organic vehicle.

The element may have an average particle diameter of about 1 nm to about 800 nm, for example, about 1 nm to about 200 nm, or for example, about 20 nm to about 60 nm. The element may be selected from at least one of silver (Ag), nickel (Ni), cobalt (Co), zinc (Zn), tin (Sn), gold (Au), platinum (Pt), palladium (Pd), lead (Pb), copper (Cu), silicon (Si), beryllium (Be), manganese (Mn), germanium (Ge), gallium (Ga), lithium (Li), magnesium (Mg), an alloy thereof, and a combination thereof.

The metal precursor may include a functional group chemically bonded with the element, the functional group including at least one of an acetate, an alkoxide, an acetylacetonate, a (meth)acrylate, a carbonylate, a carbonate, a halide, a hydroxide, a nitrate, a sulfate, a phosphate, a citrate, a hydrate thereof, and a combination thereof.

The element may be separated from the metal precursor by pyrolysis. The element may be separated from the metal precursor at a temperature ranging from about 50° C. to 1000° C. The metallic glass and the element may form a solid solution at less than or equal to about 850° C. The metallic glass and the element may form a solid solution at a temperature ranging from about 200° C. to about 350° C. The metallic glass may have a glass transition temperature of less than or equal to about 800° C. The metallic glass may have a glass transition temperature of about 50° C. to about 800° C.

The metallic glass may include at least one alloy selected from copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorous (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tm), and a combination thereof.

The metallic glass may include an aluminum-based metallic glass, a copper-based metallic glass, a titanium-based metallic glass, a nickel-based metallic glass, a zirconium-based metallic glass, an iron-based metallic glass, a cerium-based metallic glass, a strontium-based metallic glass, a gold-based metallic glass, a ytterbium-based metallic glass, a zinc-based metallic glass, a calcium-based metallic glass, a magnesium-based metallic glass, and a platinum-based metallic glass. Each of the aluminum-based metallic glass, the copper-based metallic glass, the titanium-based metallic glass, the nickel-based metallic glass, the zirconium-based metallic glass, the iron-based metallic glass, the cerium-based metallic glass, the strontium-based metallic glass, the gold-based metallic glass, the ytterbium-based metallic glass, the zinc-based metallic glass, the calcium-based metallic glass, the magnesium-based metallic glass, and the platinum-based metallic glass may include a main component of aluminum, copper, titanium, nickel, zirconium, iron, cerium, strontium, gold, ytterbium, zinc, calcium, magnesium, and platinum, respectively, and further includes at least one selected from nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), manganese (Mn), niobium (Nb), osmium (Os), vanadium (V), aluminum (Al), copper (Cu), silver (Ag), and mercury (Hg).

The conductive powder includes at least one of silver (Ag), aluminum (Al), copper (Cu), nickel (Ni), and a combination thereof. The conductive powder, the metallic glass, and the metal precursor may be included in an amount of about 30 to 99 wt %, about 0.1 to 20 wt %, about 0.1 to 20 wt %, and a remaining balance of the conductive paste is the organic vehicle.

According to example embodiments, an electrode may include a sintered product of the conductive paste.

According to example embodiments, a solar cell may include a semiconductor substrate, and at least one electrode electrically connected to the semiconductor substrate, the at least one electrode including a sintered product of the conductive paste. An oxide layer may be between the semiconductor substrate and the electrode, the oxide layer having a thickness of less than or equal to about 20 nm.

BRIEF DESCRIPTION OF THE DRAWINGS

These and/or other aspects will become apparent and more readily appreciated from the following description of example embodiments, taken in conjunction with the accompanying drawings in which.

DETAILED DESCRIPTION

Example embodiments will hereinafter be described in detail, and may be easily performed by those who have common knowledge in the related art. This disclosure may, however, be embodied in many different forms and should not be construed as limited to example embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, the term "element" may refer to a metal and a semi-metal.

First, a conductive paste according to example embodiments is described. A conductive paste according to example embodiments may include a conductive powder, a metallic glass, a metal precursor including an element forming a solid solution with the metallic glass, and an organic vehicle.

The conductive powder may include a silver (Ag)-containing metal, e.g., silver or a silver alloy, an aluminum (AD-containing metal, e.g., aluminum or an aluminum alloy, a copper (Cu)-containing metal, e.g., copper (Cu) or a copper alloy, a nickel (Ni)-containing metal, e.g., nickel (Ni) or a nickel alloy, or a combination thereof. However, the conductive powder is not limited thereto, and may include other metals and an additive other than the metals.

The conductive powder may have a size (e.g., average largest particle size) ranging from about 1 nm to about 50 μm, and may include one or more kinds of metal.

The conductive powder may be included in an amount ranging from about 30 wt % to about 99 wt % based on the total weight of the conductive paste.

The metallic glass includes an alloy having a disordered atomic structure including two or more metals or semimetals. The metallic glass may be an amorphous metal. The metallic glass includes an amorphous portion that is formed by rapidly solidifying a plurality of elements. The metallic glass may maintain the amorphous portion formed even when in a liquid phase at a relatively high temperature, or even at room temperature. Accordingly, the metallic glass has a different structure from the crystalline structure of a general alloy having a regular arrangement of atoms and is also different from the structure of liquid metals present in a liquid phase at room temperature.

Herein, the amorphous portion may be about 50 wt % to about 100 wt % of the metallic glass, for example, 70 wt % to about 100 wt %, e.g., about 90 wt % to about 100 wt %. The metallic glass has relatively low resistivity and thus relatively high conductivity, unlike a glass, e.g., a silicate.

The metallic glass may be softened at more than or equal to a glass transition temperature (Tg), where it may have a liquid-like behavior. The liquid-like behavior is maintained between the glass transition temperature (Tg) and the crystalline temperature ($T_x$) of the metallic glass, which is called a supercooled liquid region (ΔTx).

While the metallic glass has a liquid-like behavior, wettability to the lower layer may be shown, and thus the contact area of conductive paste to the lower layer may be increased. The liquid-like behavior and wettability of the metallic glass may be accomplished while heating the conductive paste.

The metallic glass may have a glass transition temperature (Tg) of less than or equal to, for example, about 800° C. The metallic glass may have a glass transition temperature (Tg) of about 50° C. to about 800° C.

The metallic glass may be an alloy including at least one selected from, for example, copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), platinum (Pt), silver (Ag), phosphorus (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tm), and a combination thereof.

The metallic glass may be, for example, aluminum-based metallic glass, copper-based metallic glass, titanium-based metallic glass, nickel-based metallic glass, zirconium-based metallic glass, iron-based metallic glass, cerium-based metallic glass, strontium-based metallic glass, gold-based metallic glass, ytterbium-based metallic glass, zinc-based metallic glass, calcium-based metallic glass, magnesium-based metallic glass, and platinum-based metallic glass, but is not limited thereto.

The aluminum-based metallic glass, copper-based metallic glass, titanium-based metallic glass, nickel-based metallic glass, zirconium-based metallic glass, iron-based metallic glass, cerium-based metallic glass, strontium-based metallic glass, gold-based metallic glass, ytterbium-based metallic glass, zinc-based metallic glass, calcium-based metallic glass, magnesium-based metallic glass, and platinum-based metallic glass may be an alloy including aluminum, copper, titanium, nickel, zirconium, iron, cerium, strontium, gold, ytterbium, zinc, calcium, magnesium, and platinum as a main component, respectively, and may further include at least one selected from nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), manganese (Mn), niobium (Nb), osmium (Os), vanadium (V), aluminum (Al), copper (Cu), silver (Ag), and mercury (Hg). Herein, the main component is an component having the highest mole ratio among the components of the metallic glass.

The metallic glass may be included in an amount of about 0.1 wt % to about 20 wt % based on the total amount of the conductive paste. The metal precursor includes at least one element and a functional group being chemically bonded with the element.

The element is a metal or semi-metal being capable of forming a solid solution with the metallic glass, and may be, for example, silver (Ag), nickel (Ni), cobalt (Co), zinc (Zn), tin (Sn), gold (Au), platinum (Pt), palladium (Pd), lead (Pb), copper (Cu), silicon (Si), beryllium (Be), manganese (Mn), germanium (Ge), gallium (Ga), lithium (Li), magnesium (Mg), an alloy thereof, or a combination thereof.

The functional group may include an organic functional group and/or an inorganic functional group capable of enhancing the dispersion of the metal precursor in the organic vehicle. The functional group may include, for example, an acetate, alkoxide, acetylacetonate, (meth)acrylate, carbonylate, carbonate, halide, hydroxide, nitrate, sulfate, phosphate, citrate, a hydrate thereof, or a combination thereof, but is not limited thereto.

The element may be separated from the metal precursor by pyrolysis while heating a conductive paste, and may be decomposed at, for example, about 50 to 1000° C., for example, at about 50 to 700° C., to be separated from the metal precursor.

The element may have a smaller size than the conductive powder and the metallic glass, and may be positioned among adjacent conductive powder particles, among adjacent metallic glass, and between the conductive powder particles and the metallic glass.

The element may be metal nanoparticles having a particle diameter of, for example, about 1 nm to about 800 nm, or a particle diameter of about 1 nm to about 200 nm, or a particle diameter of about 20 nm to about 60 nm.

The metal nanoparticles having a nano-level size show a melted phase that is different from a bulk metal which is generally called a metal. In other words, while the melting point of a bulk metal is generally set, the melting point of the metal nanoparticles may be changed depending on the size of the metal nanoparticle.

The ratio of surface area and volume is inversely increased according to the radius of the metal nanoparticles according to a decrease in the particle size of metal nanoparticles, and thus elements positioned at the surface are loosely bound to begin partial melting from the surface. The temperature starting the melting at the surface refers to a surface melting point, and the entire metal nanoparticle may be melted within a relatively short time from the starting point of surface melting due to the nano-level sized small particles.

Accordingly, an element having the particle diameter may have a surface melting point of a relatively low temperature of, for example, less than or equal to about 850° C., e.g., about 200° C. to about 350° C., and thus forms a solid solution with the metallic glass within the temperature range.

As in the above, the element and the metallic glass form a solid solution first and thus prevent or reduce the diffusion of silicon (Si) of a semiconductor substrate into the softened metallic glass at a relatively high temperature when providing an electrode on the semiconductor substrate using the conductive paste. This will be described in detail.

A spontaneously formed silicon oxide layer having a relatively thin thickness is provided on the surface of a semiconductor substrate. When the conductive paste is applied on the silicon oxide layer and heated, the silicon oxide layer may be reduced by the component (M') of metallic glass to provide a metal oxide layer ($M'_xO_y$) as represented by Reaction Scheme 1.

$M'+SiO_2 \rightarrow M'_xO_y+Si$ [Reaction Scheme 1]

According to the reaction, a part of the silicon oxide layer may be removed to form an exposed part of the semiconductor substrate, and the metallic glass may directly contact the semiconductor substrate through the exposed part of the semiconductor substrate. In example embodiments, the inter-diffusion may occur between silicon (Si) of semiconductor substrate and the softened metallic glass to diffuse silicon (Si) into the softened metallic glass. The silicon (Si) diffused into the metallic glass is oxidized to provide a thick silicon oxide layer having a thickness of greater than or equal to about 15 nm.

According to example embodiments, before providing a metal oxide layer ($M'_xO_y$) while the silicon oxide layer ($SiO_2$) is reduced, the element first forms a solid solution with the metallic glass to prevent or reduce the diffusion of silicon (Si) of semiconductor substrate into the softened metallic glass. For example, while the silicon oxide layer ($SiO_2$) is reduced, the element and the metallic glass may form a solid solution at a temperature before providing the metal oxide layer ($M'_xO_y$), which is less than or equal to about 850° C., for example, about 200° C. to about 350° C. Accordingly, the formation of the thick silicon oxide layer may be prevented or reduced, and a silicon oxide layer having a relatively thin thickness of, for example, less than or equal to about 10 nm may be provided.

The metal precursor may be included in an amount of about 0.1 wt % to about 20 wt %, for example, about 1.5 wt % to about 5 wt %, based on the total amount of the conductive paste. By including it within the range, appropriate viscosity of the conductive paste may be maintained while effectively forming a solid solution with a metallic glass.

The organic vehicle may include an organic compound mixed with a conductive powder and metallic glass that imparts viscosity to the organic vehicle, and a solvent dissolving the above components.

The organic compound may include, for example, at least one selected from a (meth)acrylate-based resin, a cellulose resin, e.g., ethyl cellulose, a phenol resin, an alcohol resin, TEFLON (tetrafluoroethylene), and a combination thereof, and may further include an additive, e.g., a dispersing agent, a surfactant, a thickener, and a stabilizer.

The solvent may be any solvent being capable of dissolving the above compounds, and may include, for example, at least one selected from terpineol, butylcarbitol, butylcarbitol acetate, pentanediol, dipentyne, limonene, ethylene glycol alkylether, diethylene glycol alkylether, ethylene glycol alkylether acetate, diethylene glycol alkylether acetate, diethylene glycol dialkylether acetate, triethylene glycol alkylether acetate, triethylene glycol alkylether, propylene glycol alkylether, propylene glycol phenylether, dipropylene glycol alkylether, tripropylene glycol alkylether, propylene glycol alkylether acetate, dipropylene glycol alkylether acetate, tripropylene glycol alkyl ether acetate, dimethylphthalic acid, diethylphthalic acid, dibutylphthalic acid, and desalted water.

The organic vehicle may be included in a balance amount excluding the solid components. The conductive paste may be fabricated by screen-printing to provide an electrode for an electronic device.

The electronic device may include, for example, a liquid crystal display (LCD), a plasma display device (PDP), an organic light emitting diode (OLED) display, and a solar cell.

As an example of the electronic device, a solar cell is described referring to drawings.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Figure 1:
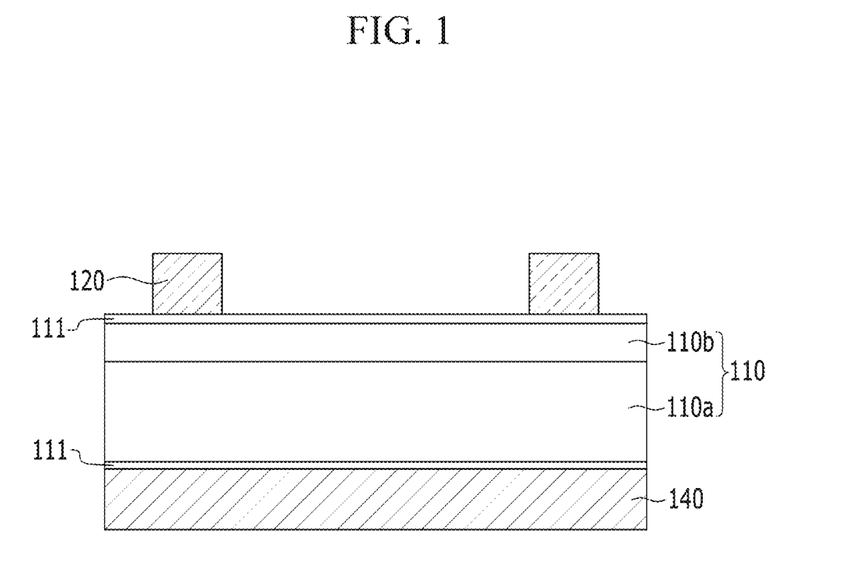
FIG. 1 is a cross-sectional view of a solar cell according to example embodiments.

Hereinafter, the location of top and bottom portions referring to one side of a semiconductor substrate 110 is illustrated for better understanding and easier description, but the location may be different in a different view. In addition, one side of the semiconductor substrate receiving solar energy is called a front side, and the other opposite side is called a rear side.

Hereinafter, a solar cell is described referring to FIG. 1. FIG. 1 is a cross-sectional view of a solar cell according to example embodiments. Referring to FIG. 1, a solar cell according to example embodiments may include a semiconductor substrate 110 including a lower semiconductor layer 110a and an upper semiconductor layer 110b.

The semiconductor substrate 110 may be formed of crystalline silicon or a compound semiconductor, and if it is formed of crystalline silicon, as an example, a silicon wafer may be used. One of the lower semiconductor layer 110a and upper semiconductor layer 110b is a semiconductor layer doped with a p-type impurity, and the other is a semiconductor layer doped with an n-type impurity. For example, the lower semiconductor layer 110a may be a semiconductor layer doped with an n-type impurity, and the upper semiconductor layer 110b a semiconductor layer doped with a p-type impurity. Herein, the n-type impurity may be a Group V compound, e.g., phosphorus (P), and the p-type impurity a Group III compound, e.g., boron (B).

A silicon oxide layer 111 having a relatively thin thickness may be provided on the semiconductor substrate 110. The silicon oxide layer 111 may be spontaneously oxidized on the semiconductor substrate 110, and may have a relatively thin thickness of less than or equal to about 10 nm.

A plurality of front electrodes 120 may be disposed on the silicon oxide layer 111. The front electrodes 120 are arranged in parallel to the direction of the substrate, and may be designed in a grid pattern with respect to shadowing loss and sheet resistance.

The front electrode 120 may include a sintered product of the conductive paste. The front electrode 120 may be formed by a screen printing method using a conductive paste, and the conductive paste may include the conductive powder, metallic glass, metal precursor, and organic vehicle as described above.

The front electrode 120 may include a portion which is formed by softening the metallic glass included in the conductive paste during the process at greater than or equal to the glass transition temperature (Tg). The portion may include a sintered product of the metallic glass and the element, and thus have conductivity.

A bus bar electrode (not shown) may be disposed on the front electrode 120. The bus bar electrode connects adjacent solar cells during assembly of a plurality of solar cells.

The silicon oxide layer 111 having a relatively thin thickness may be disposed under the semiconductor substrate 110. The silicon oxide layer 111 may be provided by spontaneously oxidizing the semiconductor substrate 110, and may have a relatively thin thickness of less than or equal to about 20 nm, for example, less than or equal to about 10 nm.

A rear electrode 140 may be disposed under the silicon oxide layer 111. The rear electrode 140 may be formed of a conductive material, for example, an opaque metal, e.g., aluminum (Al). The rear electrode 140 may be formed by a screen printing method using a conductive paste in the same manner as the front electrode 120.

The forming of an excessive oxide layer may be prevented or reduced between the front electrode 120 and the semiconductor substrate 110 and between the rear electrode 140 and the semiconductor substrate 110 as stated above, to provide a relatively low contact resistance of less than or equal to about 15 mΩcm$^2$.

Hereinafter, a method of manufacturing the solar cell of FIG. 1 is described. A semiconductor substrate 110, e.g., a silicon wafer, is prepared. The semiconductor substrate 110 may be doped with a p-type impurity, as an example.

The semiconductor substrate 110 may be subjected to a surface texturing treatment. The surface-texturing treatment may be performed in a wet method using a strong acid, e.g., nitric acid and hydrofluoric acid, or a strong base, e.g., sodium hydroxide, or in a dry method using plasma.

The semiconductor substrate 110 may be doped with an n-type impurity, as an example. The n-type impurity may be doped by diffusing POCl$_3$ or H$_3$PO$_4$ at a relatively high temperature. The semiconductor substrate 110 may include a lower semiconductor layer 110a and an upper semiconductor layer 110b doped with different impurities.

A conductive paste for a front electrode may be coated on the position where the front electrode 120 is to be disposed on the front surface of semiconductor substrate 110 according to a screen printing method, and is dried.

The conductive paste includes metallic glass as stated above, and the metallic glass may be obtained by a known method, for example, melt spinning, infiltration casting, gas atomization, ion irradiation, or mechanical alloying.

A conductive paste for a rear electrode may be coated on the position where the rear electrode 140 is to be disposed on the rear surface of the semiconductor substrate 110 according to a screen printing method, and is dried.

However, it is not limited to the screen printing, and may be obtained by various methods, e.g., Inkjet printing or imprinting.

The semiconductor substrate 110 coated with the conductive paste for a front electrode and the conductive paste for a rear electrode may be fired in a furnace at a relatively high temperature. The firing may be performed at a higher temperature than the fusion temperature of the conductive paste, and for example, may be performed at about 200 to 1,000° C., for example, at about 400 to 900° C. However, it is not limited thereto, and the conductive paste for a front electrode and the conductive paste for a rear electrode may be separately fired. In example embodiments, the firing temperatures may be the same or different.

The conductive paste may be applied to any electrodes formed at any position of either the front electrode or the rear electrode of a solar cell without limitation.

Only one example of solar cell is described above, but it is not limited thereto, and may be applied to any solar cell having any structure in the same manner.

In addition, only one example in which the conductive paste is applied to an electrode for a solar cell is described above, but it is not limited. It may be applied to all electronic devices including electrodes.

Hereinafter, the following examples illustrate this disclosure in further detail. However, it is understood that this disclosure shall not be limited by these examples.

Example 1-1

Silver (Ag) powder, metallic glass Al$_{84.5}$Ni$_{5.5}$Y$_{10}$, and silver acetate are added into an organic vehicle including an ethylcellulose binder, a surfactant, and a butylcarbitol/butylcarbitol acetate mixed solvent. The silver (Ag) powder, metallic glass Al$_{84.5}$Ni$_{5.5}$Y$_{10}$, silver acetate, and organic vehicle are included at 86 wt %, 2 wt %, 1.5 wt %, and the remaining amount, respectively, based on the total amount of conductive paste. The solution is kneaded using a 3-roll mill to provide a conductive paste. The conductive paste is applied on each of a p-type silicon wafer and n-type silicon wafer by screen printing. Both of the silicon wafers including the conductive paste are heated using a belt furnace to about 600° C., and cooled to provide an electrode sample.

Example 1-2

An electrode sample is prepared in accordance with the same procedure as in Example 1-1, except for using 2.0 wt % of silver acetate instead of 1.5 wt %.

Example 1-3

An electrode sample is prepared in accordance with the same procedure as in Example 1-1, except for using 2.5 wt % of silver acetate instead of 1.5 wt %.

Example 1-4

An electrode sample is prepared in accordance with the same procedure as in Example 1-1, except for using 3.0 wt % of silver acetate instead of 1.5 wt %.

Example 2

An electrode sample is prepared in accordance with the same procedure as in Example 1-2, except for using 1.0 wt % of silver acetate and 1.0 wt % of nickel acetate instead of 2.0 wt % of silver acetate.

Example 3

An electrode sample is prepared in accordance with the same procedure as in Example 1-2, except for using 1.0 wt % of silver acetate and 1.0 wt % of cobalt acetylacetonate (Co acetylacetonate) instead of 2.0 wt % of silver acetate.

Example 4

An electrode sample is prepared in accordance with the same procedure as in Example 1-2, except for using 1.0 wt % of silver acetate and 1.0 wt % of zinc acetate (Zn acetate) instead of 2.0 wt % of silver acetate.

Comparative Example 1

An electrode sample is prepared in accordance with the same procedure as in Example 1-2, except for not using silver acetate.

Comparative Example 2

An electrode sample is prepared in accordance with the same procedure as in Example 1-2, except for using a PbO—SiO$_2$—Bi$_2$O$_3$-based glass frit instead of metallic glass Al$_{84.5}$Ni$_{5.5}$Y$_{10}$.

Evaluation 1

The electrode samples according to Example 1-2 and Comparative Example 1 are observed by using a scanning electron microscope (SEM).

Figure 2:
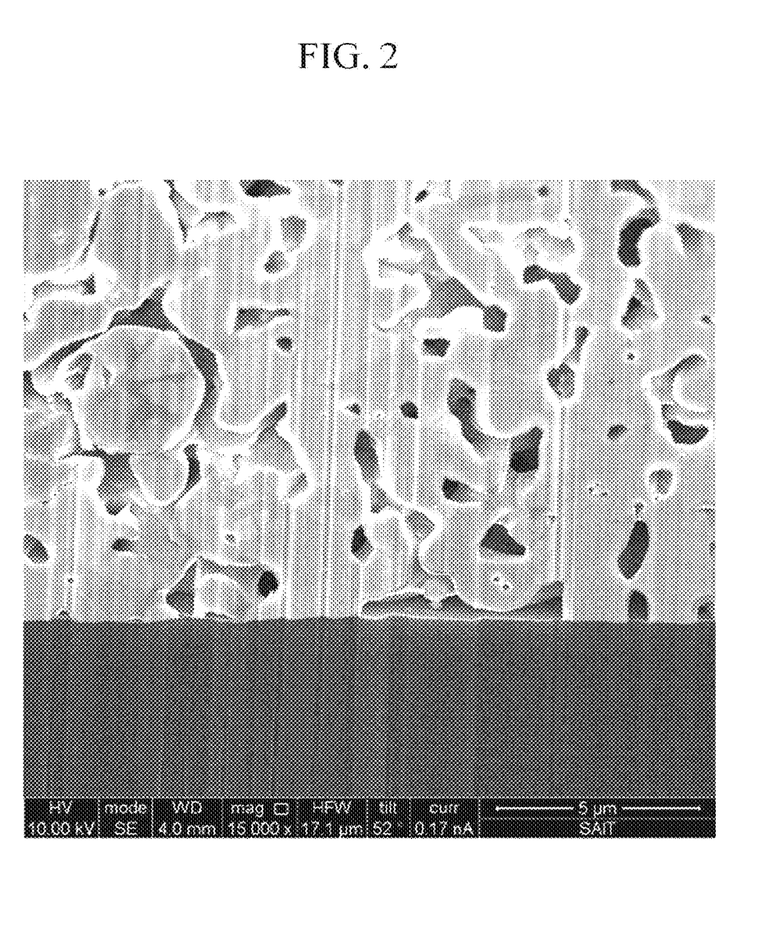
FIG. 2 is a scanning electron microscope (SEM) photograph of an electrode sample according to Example 1-2.
Figure 3:
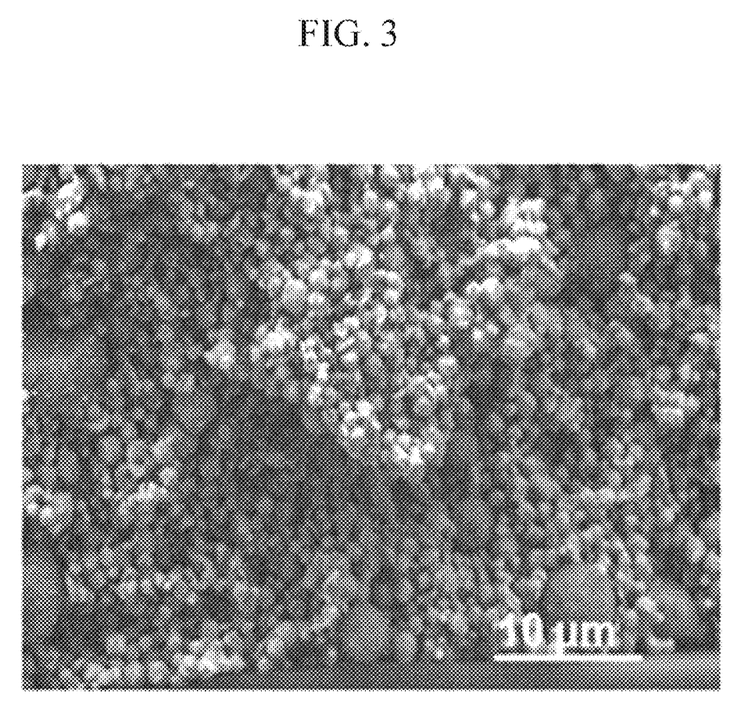
FIG. 3 is a scanning electron microscope (SEM) photograph of an electrode sample according to Comparative Example 1.

FIG. 2 is a scanning electron microscope (SEM) photograph of an electrode sample according to Example 1-2, and FIG. 3 is a scanning electron microscope (SEM) photograph of an electrode sample according to Comparative Example 1.

Referring to FIG. 2 and FIG. 3, the electrode sample according to Example 1-2 improves the sinterability compared to the electrode sample according to Comparative Example 1.

Evaluation 2

The electrode samples according to Example 1-2 and Comparative Example 1 are observed by using a transmission electron microscope (TEM).

Figure 4:
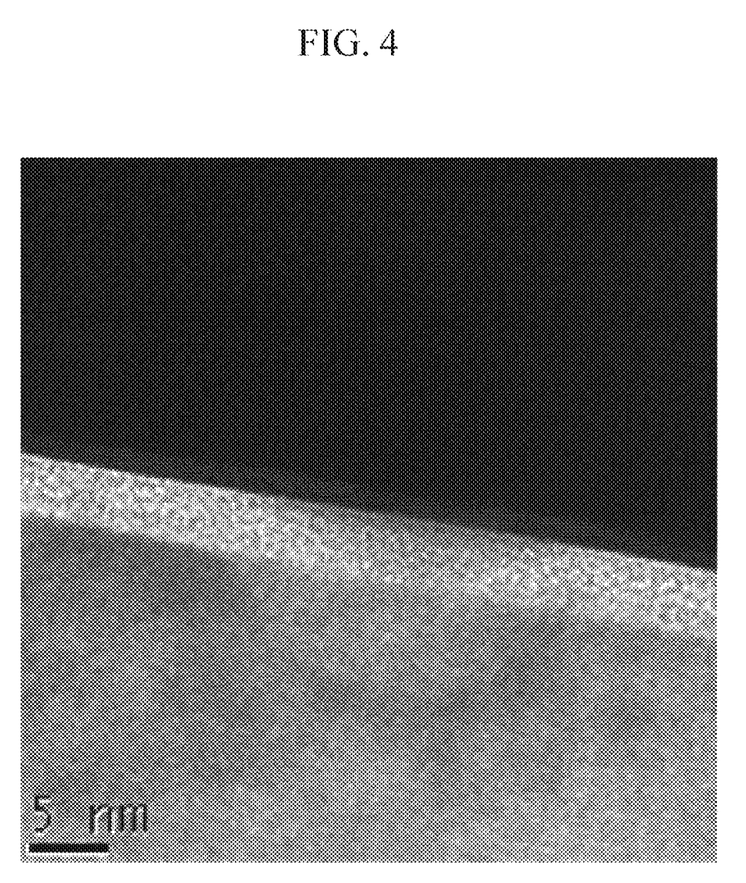
FIG. 4 is a transmission electron microscope (TEM) photograph of an electrode sample according to Example 1-2.
Figure 5:
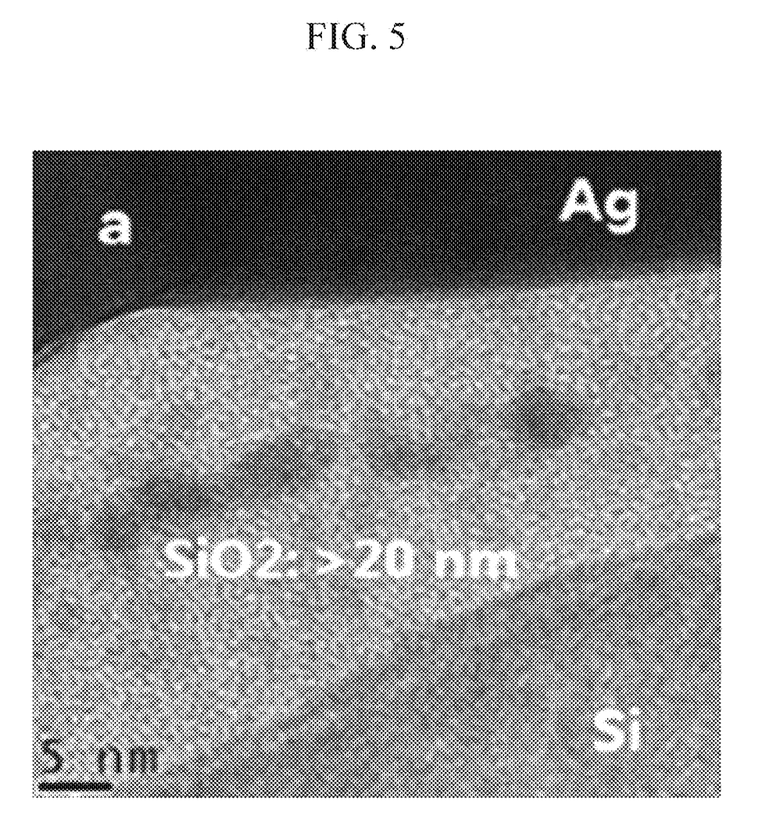
FIG. 5 is a transmission electron microscope (TEM) photograph of an electrode sample according to Comparative Example 1.

FIG. 4 is a transmission electron microscope (TEM) photograph of an electrode sample according to Example 1-2, and FIG. 5 is a transmission electron microscope (TEM) photograph of an electrode sample according to Comparative Example 1.

Referring to FIG. 4 and FIG. 5, the electrode sample according to Example 1-2 is formed with an oxide layer having a relatively thin thickness of about 5 nm to 10 nm, and on the other hand, the electrode sample according to Comparative Example 1 is formed with an oxide layer having a relatively thick thickness of about 20 nm.

Evaluation 3

The electrode samples according to Examples 1-1 to 1-4, Examples 2 to 4, and Comparative Examples 1 and 2 are measured for contact resistance and resistivity.

The contact resistance is measured by a transmission line method (TLM). An electrode sample having a length of 10 cm and a line width of 400 μm is measured for resistance, and the cross-section of the electrode sample is measured by a 3-D laser confocal microscope to calculate the resistivity.

The results are shown in Table 1.

TABLE 1

| | Contact resistance (mΩcm$^2$) | | |
| --- | --- | --- | --- |
| | p-type | n-type | Resistivity (mΩcm) |
| Example 1-1 | 1.68 | 10.85 | 3.2 |
| Example 1-2 | 0.9 | 10.61 | 3.3 |
| Example 1-3 | 0.75 | 2.96 | 3.3 |
| Example 1-4 | 1.60 | 2.71 | 3.7 |
| Example 2 | 1.56 | 1.36 | 6.0 |
| Example 3 | 1.38 | 1.15 | 7.0 |
| Example 4 | 5.50 | 4.74 | 10.0 |
| Comparative Example 1 | 15.8 | >30 | 7.95 |
| Comparative Example 2 | >30 | 5.2 | 4.0 |

Referring to Table 1, the electrode samples according to Examples 1-1 to 1-4 and Examples 2 to 4 have relatively low contact resistance and relatively low resistivity compared to the electrode samples according to Comparative Examples 1 and 2.

While this disclosure has been described in connection with what is presently considered to be practical example embodiments, it is to be understood that the disclosure is not limited to the disclosed embodiments, but, on the contrary, is intended to cover various modifications and equivalent arrangements included within the spirit and scope of the appended claims.

What is claimed is:

1. A conductive paste comprising:
    a conductive powder;
    a metallic glass;
    an organometallic precursor including a component that forms a solid solution with the metallic glass and a functional group bonded to the component,
        the component being a metallic element having an average particle diameter of about 1 nm to about 800 nm; and
    an organic vehicle,
    wherein the component has a smaller size than each of the conductive powder and the metallic glass,
    wherein the functional group is chemically bonded with the component,
    wherein the functional group includes at least one of an acetate, an alkoxide, an acetylacetonate, a (meth)acrylate, a carbonylate, a carbonate, a halide, a hydroxide, a nitrate, a sulfate, a phosphate, a citrate, an acetate hydrate, an alkoxide hydrate, an acetylacetonate hydrate, a (meth)acrylate hydrate, a carbonylate hydrate, a carbonate hydrate, a halide hydrate, a hydroxide hydrate, a nitrate hydrate, a sulfate hydrate, a phosphate hydrate, a citrate hydrate, and a combination thereof, and
    wherein the component is selected from at least one of silver (Ag), nickel (Ni), cobalt (Co), zinc (Zn), tin (Sn), gold (Au), platinum (Pt), palladium (Pd), lead (Pb), copper (Cu), silicon (Si), beryllium (Be), manganese (Mn), germanium (Ge), gallium (Ga), magnesium (Mg), an alloy thereof, and a combination thereof.

2. The conductive paste of claim 1, wherein the component has an average particle diameter of about 1 nm to about 200 nm.

3. The conductive paste of claim 2, wherein the component has an average particle diameter of about 20 nm to about 60 nm.

4. The conductive paste of claim 1, wherein the component capable of being separated from the organometallic precursor by pyrolysis.

5. The conductive paste of claim 4, wherein the component is capable of being separated from the organometallic precursor at a temperature ranging from about 50° C. to 1000° C.

6. The conductive paste of claim 1, wherein the metallic glass and the component are capable of forming a solid solution at a temperature higher than a surface melting point of the component and less than or equal to about 850° C.

7. The conductive paste of claim 6, wherein the metallic glass and the component are capable of forming a solid solution at a temperature ranging from about 200° C. to about 350° C.

8. The conductive paste of claim 1, wherein the metallic glass has a glass transition temperature of less than or equal to about 800° C.

9. The conductive paste of claim 8, wherein the metallic glass has a glass transition temperature of about 50° C. to about 800° C.

10. The conductive paste of claim 1, wherein the metallic glass includes at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorous (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tm), and a combination thereof.

11. The conductive paste of claim 1, wherein the metallic glass includes an aluminum-based metallic glass, a copper-based metallic glass, a titanium-based metallic glass, a nickel-based metallic glass, a zirconium-based metallic glass, an iron-based metallic glass, a cerium-based metallic glass, a strontium-based metallic glass, a gold-based metallic glass, a ytterbium-based metallic glass, a zinc-based metallic glass, a calcium-based metallic glass, a magnesium-based metallic glass, and a platinum-based metallic glass, and wherein each of the aluminum-based metallic glass, the copper-based metallic glass, the titanium-based metallic glass, the nickel-based metallic glass, the zirconium-based metallic glass, the iron-based metallic glass, the cerium-based metallic glass, the strontium-based metallic glass, the gold-based metallic glass, the ytterbium-based metallic glass, the zinc-based metallic glass, the calcium-based metallic glass, the magnesium-based metallic glass, and the platinum-based metallic glass includes a main component of aluminum, copper, titanium, nickel, zirconium, iron, cerium, strontium, gold, ytterbium, zinc, calcium, magnesium, and platinum, respectively, and further includes at least one selected from nickel (Ni), yttrium (Y), cobalt (Co), lanthanum (La), zirconium (Zr), iron (Fe), titanium (Ti), calcium (Ca), beryllium (Be), magnesium (Mg), sodium (Na), molybdenum (Mo), tungsten (W), tin (Sn), zinc (Zn), potassium (K), lithium (Li), phosphorus (P), palladium (Pd), platinum (Pt), rubidium (Rb), chromium (Cr), strontium (Sr), cerium (Ce), praseodymium (Pr), promethium (Pm), samarium (Sm), lutetium (Lu), neodymium (Nd), niobium (Nb), gadolinium (Gd), terbium (Tb), dysprosium (Dy), holmium (Ho), erbium (Er), thulium (Tm), thorium (Th), scandium (Sc), barium (Ba), ytterbium (Yb), europium (Eu), hafnium (Hf), arsenic (As), plutonium (Pu), gallium (Ga), germanium (Ge), antimony (Sb), silicon (Si), cadmium (Cd), indium (In), manganese (Mn), niobium (Nb), osmium (Os), vanadium (V), aluminum (Al), copper (Cu), silver (Ag), and mercury (Hg).

12. The conductive paste of claim 1, wherein the conductive powder includes at least one of silver (Ag), aluminum (Al), copper (Cu), nickel (Ni), and a combination thereof.

13. The conductive paste of claim 1, wherein the conductive powder, the metallic glass, and the organometallic precursor respectively are included amounts of about 30 to 99 wt %, about 0.1 to 20 wt %, about 0.1 to 20 wt %, and a remaining balance of the conductive paste is the organic vehicle.

14. An electrode comprising:
a sintered product of the conductive paste according to claim 1.

15. A solar cell comprising:
a semiconductor substrate; and
at least one electrode electrically connected to the semiconductor substrate, the at least one electrode including a sintered product of the conductive paste of claim 1.

16. The solar cell of claim 15, further comprising:
an oxide layer between the semiconductor substrate and the electrode, the oxide layer having a thickness of less than or equal to about 20 nm.

17. The solar cell of claim 15, wherein the component has an average particle diameter of about 1 nm to about 800 nm.

18. The solar cell of claim 15, wherein the component is selected from at least one of silver (Ag), nickel (Ni), cobalt (Co), zinc (Zn), tin (Sn), gold (Au), platinum (Pt), palladium (Pd), lead (Pb), copper (Cu), silicon (Si), beryllium (Be), manganese (Mn), germanium (Ge), gallium (Ga), lithium (Li), magnesium (Mg), an alloy thereof, and a combination thereof.

19. The solar cell of claim 15, wherein the metallic glass includes at least one of copper (Cu), titanium (Ti), nickel (Ni), zirconium (Zr), iron (Fe), magnesium (Mg), calcium (Ca), cobalt (Co), palladium (Pd), platinum (Pt), gold (Au), cerium (Ce), lanthanum (La), yttrium (Y), gadolinium (Gd), beryllium (Be), tantalum (Ta), gallium (Ga), aluminum (Al), hafnium (Hf), niobium (Nb), lead (Pb), silver (Ag), phosphorous (P), boron (B), silicon (Si), carbon (C), tin (Sn), zinc (Zn), molybdenum (Mo), tungsten (W), manganese (Mn), erbium (Er), chromium (Cr), praseodymium (Pr), thulium (Tm), and a combination thereof.

20. The solar cell of claim 15, wherein the conductive powder, the metallic glass, and the organometallic precursor respectively are included in amounts of about 30 to 99 wt %, about 0.1 to 20 wt %, about 0.1 to 20 wt %, and a remaining balance of the conductive paste is the organic vehicle.

21. The conductive paste of claim 1, wherein
the organometallic precursor is configured to reduce the growth of a silicon oxide layer, based on silicon (Si) from a semiconductor substrate including Si diffusing into the metallic glass, if the conductive paste is heated to form an electrode on the semiconductor substrate, and the organometallic precursor is configured to reduce the growth of the silicon oxide layer compared to a thickness of the silicon oxide layer that would form if the conductive paste does not include the organometallic precursor and is heated to form the electrode on the semiconductor substrate.

22. A conductive paste comprising:
a conductive powder;
a metallic glass;
an organometallic precursor including a component that forms a solid solution with the metallic glass and a functional group bonded to the component,
the component being a metallic element having an average particle diameter of about 1 nm to about 800 nm; and
an organic vehicle,
wherein the component has a smaller size than the conductive powder and the metallic glass.

23. A conductive paste comprising:
a conductive powder;
a metallic glass;
an organometallic precursor including a component that forms a solid solution with the metallic glass and a functional group bonded to the component,
the component being a metallic element having an average particle diameter of about 1 nm to about 800 nm; and
an organic vehicle,
wherein the component has a smaller size than each of the conductive powder and the metallic glass, and
wherein the functional group is chemically bonded with the component, and the functional group includes at least one of an acetate, an alkoxide, an acetylacetonate, a (meth)acrylate, a carbonylate, a carbonate, a halide, a hydroxide, a nitrate, a sulfate, a phosphate, a citrate, an acetate hydrate, an alkoxide hydrate, an acetylacetonate hydrate, a (meth)acrylate hydrate, a carbonylate hydrate, a carbonate hydrate, a halide hydrate, a hydroxide hydrate, a nitrate hydrate, a sulfate hydrate, a phosphate hydrate, a citrate hydrate, and a combination thereof.

24. The conductive paste of claim 22, wherein the component is selected from at least one of silver (Ag), nickel (Ni), cobalt (Co), zinc (Zn), tin (Sn), gold (Au), platinum (Pt), palladium (Pd), lead (Pb), copper (Cu), silicon (Si), beryllium (Be), manganese (Mn), germanium (Ge), gallium (Ga), lithium (Li), magnesium (Mg), an alloy thereof, and a combination thereof.

25. The conductive paste of claim 1, wherein
the organometallic precursor is configured to reduce the growth of a silicon oxide layer, based on silicon (Si) from a semiconductor substrate including Si diffusing into the metallic glass, if the conductive paste is heated to form an electrode on the semiconductor substrate, and
the organometallic precursor is configured to reduce the growth of the silicon oxide layer compared to a thickness of the silicon oxide layer that would form if the conductive paste does not include the organometallic precursor and is heated to form the electrode on the semiconductor substrate.

* * * * *